United States Patent [19]
Kawaguchi et al.

[11] Patent Number: 5,863,834
[45] Date of Patent: Jan. 26, 1999

[54] SEMICONDUCTOR DEVICE AND METHOD OF MANUFACTURING THE SAME

[75] Inventors: Akemi Kawaguchi, Osaka; Nobuo Aoi, Hyogo; Minoru Kubo, Mie, all of Japan

[73] Assignee: Matsushita Electric Industrial Co., Ltd., Osaka, Japan

[21] Appl. No.: 811,300

[22] Filed: Mar. 4, 1997

[30] Foreign Application Priority Data

Mar. 6, 1996 [JP] Japan ..................................... 8-048596
Sep. 2, 1996 [JP] Japan ..................................... 8-232043

[51] Int. Cl.$^6$ ................................................. H01L 21/4763
[52] U.S. Cl. ........................... 438/625; 438/636; 430/318
[58] Field of Search ............................... 438/104, 98, 233, 438/523, 571, 584, 625, 636; 148/240; 430/311, 318

[56] References Cited

FOREIGN PATENT DOCUMENTS

| | | |
|---|---|---|
| 60-005928 | 1/1985 | Japan . |
| 63-293861 | 11/1988 | Japan . |
| 2-026029 | 1/1990 | Japan . |
| 5-291208 | 11/1993 | Japan . |
| 6-342793 | 12/1994 | Japan . |

*Primary Examiner*—Charles Bowers
*Assistant Examiner*—Craig Thompson
*Attorney, Agent, or Firm*—McDermott, Will & Emery

[57] ABSTRACT

A first insulating film is formed on a semiconductor substrate. A metal wire made of an aluminum alloy containing copper is formed on the first insulating film. An antireflection film is formed on the top face of the metal wire. On the region of the side face of the metal wire uncovered with an aluminum oxide film, there is formed a copper sulfide film, which is a sulfide film of copper. A second insulating film is formed over the metal wire formed with the antireflection film as well as the copper sulfide film and the first insulating film.

6 Claims, 12 Drawing Sheets

F I G. 12 (a)
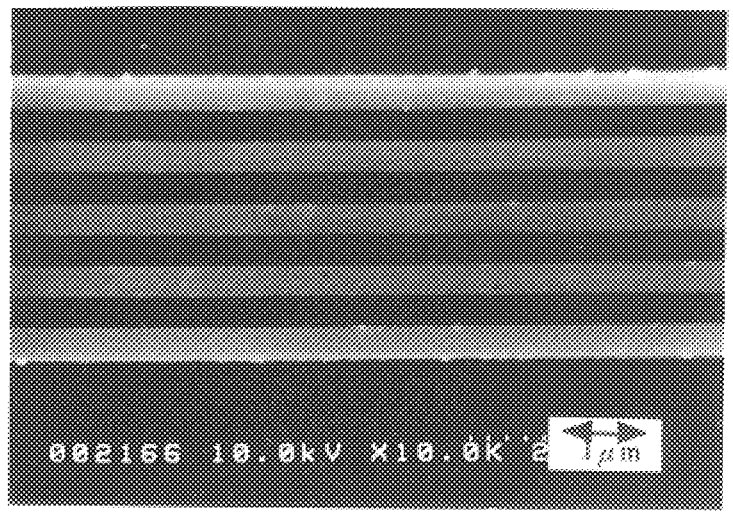
F I G. 12 (b)
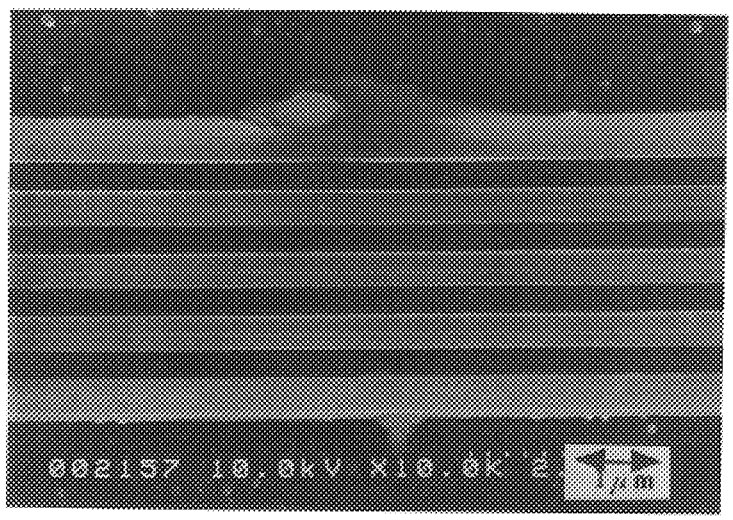

SEMICONDUCTOR DEVICE AND METHOD OF MANUFACTURING THE SAME

BACKGROUND OF THE INVENTION

The present invention relates to a semiconductor device and a method of manufacturing the same and, more particularly, to technology for preventing corrosion of a metal wire made of an aluminum alloy containing copper, which is formed on a semiconductor substrate.

In general, corrosion of metal is greatly affected by a state on the surface thereof. For example, aluminum used in a metal wire formed on a semiconductor substrate exhibits improved resistance to corrosion with an extremely thin native oxide film densely formed on the surface thereof.

However, when a metal film made of aluminum formed on the semiconductor substrate is subjected to dry etching using etching gas containing chlorine gas, a residue of chlorine ions contained in the etching gas may react disadvantageously with moisture contained in an atmosphere to form a hydrochloric acid, which causes corrosion of the native oxide film on aluminum.

To remove the residual chlorine ions after dry etching using the etching gas containing chlorine gas, there has been proposed a method of substituting fluorine ions for the chlorine ions by plasma processing using $CF_4$, thereby forming an organic film for protecting the metal wire on the surface of aluminum (Japanese Laid-Open Patent Publication HEI 2-26029). To prevent the reaction between the chlorine ions and the moisture contained in the atmosphere, there have been proposed a method of oxidizing the surface of aluminum with an oxidizing agent so as to passivate aluminum, i.e., to form an oxide film on the surface thereof (Japanese Laid-Open Patent Publication SHO 63-293861) and a method of performing etching under vacuum so as to prevent the metal wire from being exposed to the atmosphere after etching (Japanese Laid-Open Patent Publication SHO 60-5928).

For verification, the present inventors have made various examinations of the foregoing methods of preventing corrosion of the metal wire to find that, though the foregoing methods are effective with respect to a metal wire made of aluminum, they are not perfectly effective with respect to a metal wire made of an aluminum alloy containing copper, which has been added to improve resistance to electromigration.

This is because a potential difference produced between aluminum and about several percent of copper added thereto forms a local cell, which may cause corrosion on the surface of the metal wire merely by immersing the metal wire in pure water during a cleaning process or the like. However, no prevention measure has been taken previously against the corrosion resulting from the local cell effect caused by the potential difference between aluminum and copper.

SUMMARY OF THE INVENTION

In view of the foregoing, an object of the present invention is to prevent corrosion of a metal wire made of an aluminum alloy containing copper.

To attain the above object, the present invention forms a copper sulfide film on the surface of the metal wire made of the aluminum alloy containing copper to prevent the formation of a local cell between aluminum and copper, thereby preventing corrosion of the metal wire resulting from the local cell effect caused by a potential difference between aluminum and copper.

A first semiconductor device according to the present invention comprises: a metal wire formed on a semiconductor substrate, the metal wire being composed of an aluminum alloy containing copper; an antireflection film formed on the top face of the metal wire; and copper sulfide films formed on the regions of the both side faces of the metal wire uncovered with an aluminum oxide film.

In the first semiconductor device, the copper sulfide films are formed on the regions of the both side faces of the metal wire uncovered with the aluminum oxide film, so that the copper sulfide films are not dissolved in a hydrochloric acid formed by the reaction of chlorine remaining after dry etching using chlorine-based gas with moisture contained in an atmosphere. Consequently, copper contained in the aluminum alloy is not exposed and hence no electric field is formed between aluminum composing the metal film and the hydrochloric acid, which prevents corrosion of the aluminum oxide film. Moreover, since the copper sulfide films are not damaged by corrosive ions contained in the residual etching gas, corrosion of the metal wire made of the aluminum alloy containing copper can be prevented positively.

A second semiconductor device according to the present invention comprises: a metal wire formed on a semiconductor substrate, the metal wire being composed of an aluminum alloy containing copper; and a copper sulfide film formed on the regions of the top face and both side faces of the metal wire uncovered with an aluminum oxide film.

In the second semiconductor device, the copper sulfide film is formed on the regions of the top and both side faces of the metal wire uncovered with the aluminum oxide film, so that no electric field is formed between aluminum composing the metal wire and the hydrochloric acid, which prevents corrosion of the aluminum oxide film, similarly to the first semiconductor device. As a result, corrosion of the metal wire made of the aluminum alloy containing copper can be prevented positively.

A first method of manufacturing a semiconductor device according to the present invention comprises: a metal-film depositing step of depositing a metal film on a semiconductor substrate; an antireflection-film depositing step of depositing an antireflection film on the metal film; a resist-pattern forming step of forming a resist pattern on the antireflection film; a metal-wire forming step of forming a metal wire composed of the metal film by etching the antireflection film and the metal film by using the resist pattern as a mask; and a sulfide-film forming step of forming, after removing the resist pattern, copper sulfide films on the regions of the both side faces of the metal wire uncovered with an aluminum oxide film.

In accordance with the first method of manufacturing a semiconductor device, etching is performed with respect to the antireflection film and the metal film to form the metal wire and then the copper sulfide films are formed on the regions of the both side faces of the metal wire uncovered with the aluminum oxide film. Consequently, the antireflection film is formed on the top face of the metal wire, while the copper sulfide film is formed on the regions of the both side faces of the metal wire uncovered with the aluminum oxide film.

A second method of manufacturing a semiconductor device according to the present invention comprises: a metal-film depositing step of depositing a metal film on a semiconductor substrate; a resist-pattern forming step of forming a resist pattern on the metal film; a metal-wire forming step of forming a metal wire composed of the metal film by etching the metal film by using the resist pattern as a mask; and a sulfide-film forming step of forming, after removing the resist pattern, a copper sulfide film on the regions of the top face and both side faces of the metal wire uncovered with an aluminum oxide film.

In accordance with the second method of manufacturing a semiconductor device, etching is performed with respect to the metal film to form the metal wire and then the copper sulfide film is formed on the regions of the top and both side faces of the metal wire uncovered with the aluminum oxide film. Consequently, the copper sulfide films are formed on the top and both side faces of the metal wire uncovered with the aluminum oxide film.

In the first or second method of manufacturing a semiconductor device, the sulfide-film forming step preferably includes the step of forming the copper sulfide film by immersing the semiconductor substrate in a solution of ammonia sulfide. The arrangement enables low-cost and simple formation of the copper sulfide film.

A third method of manufacturing a semiconductor device according to the present invention comprises: a metal-film depositing step of depositing a metal film on a semiconductor substrate; a first sulfide-film forming step of forming a copper sulfide film on the region of the top face of the metal film uncovered with an aluminum oxide film; a resist-pattern forming step of forming a resist pattern on the copper sulfide film; a metal-wire forming step of forming a metal wire composed of the metal film by etching the metal film by using the resist pattern as a mask; and a second sulfide-film forming step of forming, after removing the resist pattern, a copper sulfide film on the region of the metal wire uncovered with an aluminum oxide film.

In accordance with the third method of manufacturing a semiconductor device, the copper sulfide film is formed on the region of the top face of the metal film formed on the semiconductor substrate uncovered with the aluminum oxide film and then etching is performed with respect to the metal film to form the metal wire. Subsequently, the copper sulfide films are formed on the regions of the top and both side faces of the metal wire uncovered with the aluminum oxide film, so that the copper sulfide films are formed on the top and both side faces of the metal wire uncovered with the aluminum oxide film.

In the third method of manufacturing a semiconductor device, at least one of the first sulfide-film forming step and the second sulfide-film forming step preferably includes the step of forming the copper sulfide film by immersing the semiconductor substrate in a solution of ammonia sulfide. The arrangement enables low-cost and simple formation of the copper sulfide film.

BRIEF DESCRIPTION OF THE DRAWINGS

FIG. 12(a) is a micrograph showing a two-dimensional structure of a metal wire with a copper sulfide film formed on the surface thereof and FIG. 12(b) is a micrograph showing a two-dimensional structure of a metal wire without a copper sulfide film.

DETAILED DESCRIPTION OF THE INVENTION

Figure 1A:
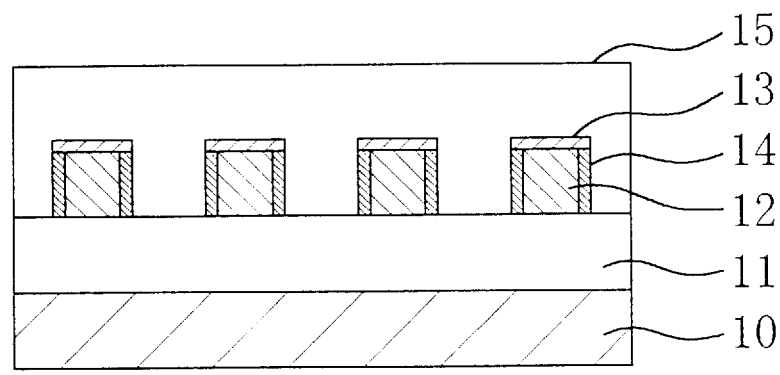
FIG. 1(a) is a cross-sectional view of a semiconductor device according to a first embodiment of the present invention and FIG. 1(b) is a cross-sectional view of a semiconductor device according to a second embodiment of the present invention.

Referring now to the drawings, semiconductor devices and methods of manufacturing the same according to the individual embodiments of the present invention will be described.

(First Embodiment)

FIG. 1(a) shows a cross-sectional structure of a semiconductor device according to a first embodiment of the present invention. As shown in the drawing, a first insulating film 11 made of, e.g., $SiO_2$ is formed on a semiconductor substrate 10. On the first insulating film 11, there is formed a metal wire 12 made of an aluminum alloy containing copper, such as an alloy of 99.5 wt % of aluminum and 0.5 wt % of copper. On the top face of the metal wire 12, there is formed an antireflection film 13 made of, e.g., TiN. The antireflection film 13 is for preventing the reflection of exposing light during the step of forming a resist pattern serving as a mask in etching the metal wire 12.

The first embodiment is characterized in that copper sulfide films 14 represented by $Cu_xS$ ($1 \leq x \leq 2$), which is a sulfide film of copper, are formed on the regions of the side faces of the metal wire 12 uncovered with an oxidation film of aluminum ($Al_2O_3$).

Over the metal wire 12 formed with the antireflection film 13 as well as the copper sulfide films 14 and the first insulating film 11, a second insulating film 15 is formed to cover the entire surface of the structure.

(Second Embodiment)

Figure 1B:
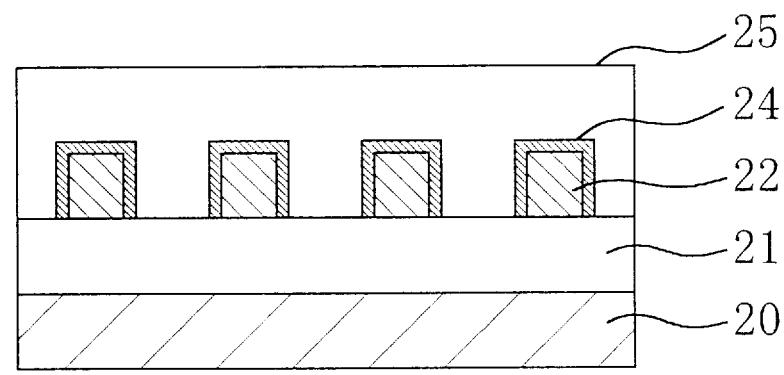

FIG. 1(b) shows a cross-sectional structure of a semiconductor device according to a second embodiment of the present invention. As shown in the drawing, a first insulating film 21 made of, e.g., $SiO_2$ is formed on the a semiconductor substrate 20. On the first insulating film 21, there is formed a metal wire 22 made of, e.g., an aluminum alloy containing copper, such as an alloy of 99.5 wt % of aluminum and 0.5 wt % of copper.

The second embodiment is characterized in that a copper sulfide film 24 represented by $Cu_xS$ ($1 \leq x \leq 2$), similarly to the first embodiment, is formed on the regions of the top and side faces of the metal wire 22 uncovered with an aluminum oxide film.

Over the metal wire 22 formed with the copper sulfide film 24 and the first insulating film 21, a second insulating film 25 is formed to cover the entire surface of the structure.

Figure 2A:
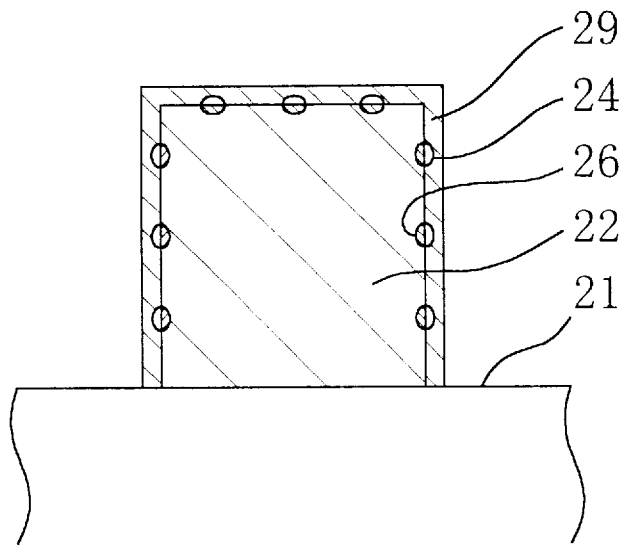
FIG. 2(a) is a cross-sectional view of a metal wire in the semiconductor device according to the second embodiment and FIG. 2(b) is an enlarged cross-sectional view of the metal wire shown in FIG. 2(a)
Figure 2B:
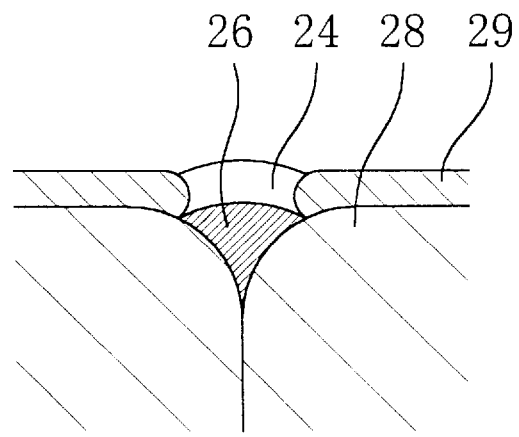

FIGS. 2(a) and 2(b) show a cross-sectional structure of the metal wire 22 in the semiconductor device according to the second embodiment. On the surface of the metal wire 22, copper 26 composing the aluminum alloy is locally precipitated. An aluminum oxide film 29 is formed on aluminum crystals 28 on the surface of the metal wire 22, while the copper sulfide film 24 is formed on the surface of copper 26 locally precipitated on a grain boundary of the aluminum crystals 28, i.e., on the region of the entire surface of the metal wire 22 uncovered with the aluminum oxide film (native oxide film) 29.

According to the second embodiment, the copper sulfide film 24 more stable than a copper oxide film is formed on the region of the surface of the metal wire 22 uncovered with the aluminum oxide film, so that corrosion of the metal wire 22 is prevented. If the copper sulfide film 24 is not formed, the copper oxide film is formed on the surface of locally precipitated copper 26 to be dissolved in a hydrochloric acid formed by the reaction of chlorine remaining after dry etching using chlorine-based gas with moisture contained in an atmosphere, which uncovers and exposes copper 26. Since the exposed copper 26 serves as a cathode, an electric field is formed between the aluminum crystal 28 and the hydrochloric acid, which induces pitting corrosion of the oxide film 29. In the case where the copper sulfide film 24 is formed on the surface of copper 26, copper 26 is not exposed since the copper sulfide film 24 is not dissolved in the hydrochloric acid, so that copper 26 does not serve as a cathode and hence no electric field is formed between the aluminum crystal 28 and the hydrochloric acid. Therefore, the oxide film 29 is free from corrosion.

Moreover, since the copper sulfide film 24 is not damaged by corrosive ions contained in the residual etching gas, corrosion of the metal wire 22 is prevented. In this case, even when a reaction product containing chlorine used in the patterning step for forming the metal wire 22 is deposited on the side face of the metal wire 22, the effect of preventing corrosion of the metal wire 22 is unaffected since the copper sulfide film 24 is formed on the foregoing reaction product.

The foregoing description applies to each of the semiconductor devices according to the first and second embodiments, in which corrosion of the metal wire resulting from the local cell effect as well as corrosion of the metal wire caused by the corrosive ions contained in the residual etching gas can surely be prevented.

(First Method of Manufacturing Semiconductor Device According to First Embodiment)

A first method of manufacturing the semiconductor device according to the first embodiment will be described with reference to FIGS. 3(a) to 3(c) and FIGS. 4(a) to 4(c).

Figure 3A:
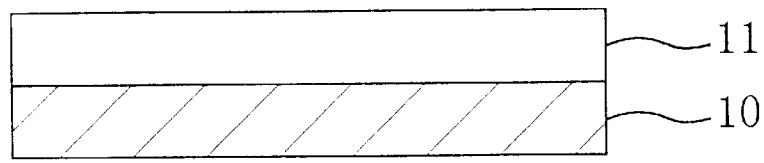
FIG. 3(a) to 3(c) are cross-sectional views illustrating the individual process steps by a first method of manufacturing the semiconductor device according to the first embodiment.
Figure 3B:
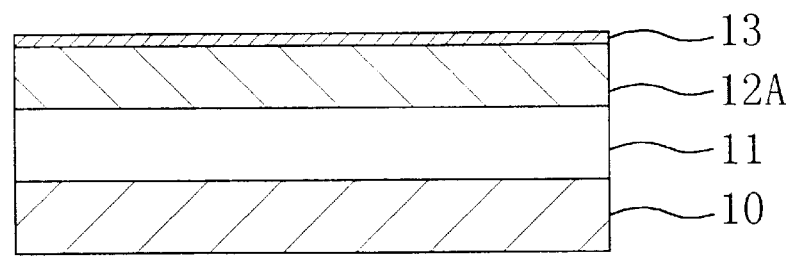

First, as shown in FIG. 3(a), the first silicon oxide (SiO$_2$) film 11 as the first insulating film is formed on the semiconductor substrate 10. Then, as shown in FIG. 3(b), a metal film 12A made of an aluminum alloy containing copper and the antireflection film 13 are sequentially deposited by sputtering on the first silicon oxide film 11.

Figure 3C:
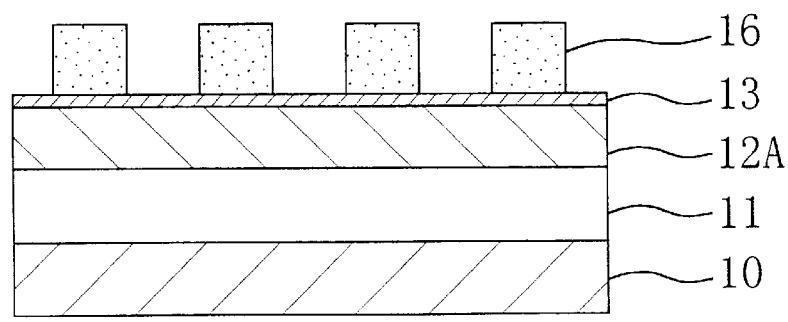
Figure 4A:
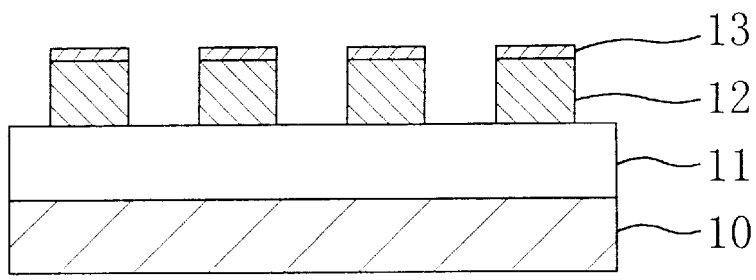
FIG. 4(a) to 4(c) are cross-sectional view illustrating the individual process steps by the first method of manufacturing the semiconductor device according to the first embodiment.

Next, as shown in FIG. 3(c), a resist pattern 16 is formed on the antireflection film 13, which is then used as a mask in a dry-etching process performed with respect to the antireflection film 13 and the metal film 12A to form the metal wire 12 as shown in FIG. 4(a), followed by the removal of the resist pattern 16 by ashing using an oxygen plasma.

Figure 4B:
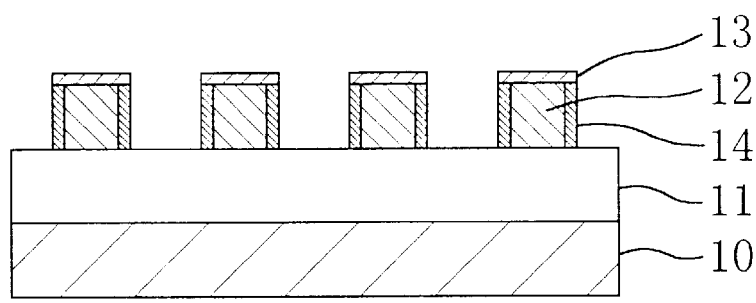
Figure 4C:
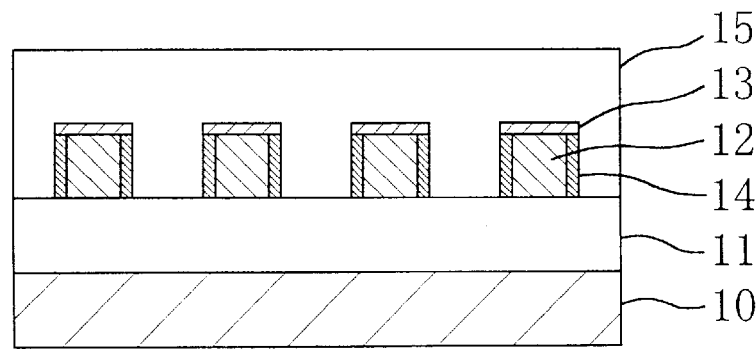

Next, as shown in FIG. 4(b), the copper sulfide films 14 are formed on the side faces of the metal wire 12 in accordance with first to fifth methods of forming copper sulfide films which will be described below, thereby protecting the surface of copper locally precipitated on the surface of the metal wire 12. After that, the surface of the semiconductor substrate 10 is cleaned so that the second silicon oxide film 15 as the second insulating film is deposited over the entire surface.

A description will be given to a first method of forming a copper sulfide film.

Figure 9:
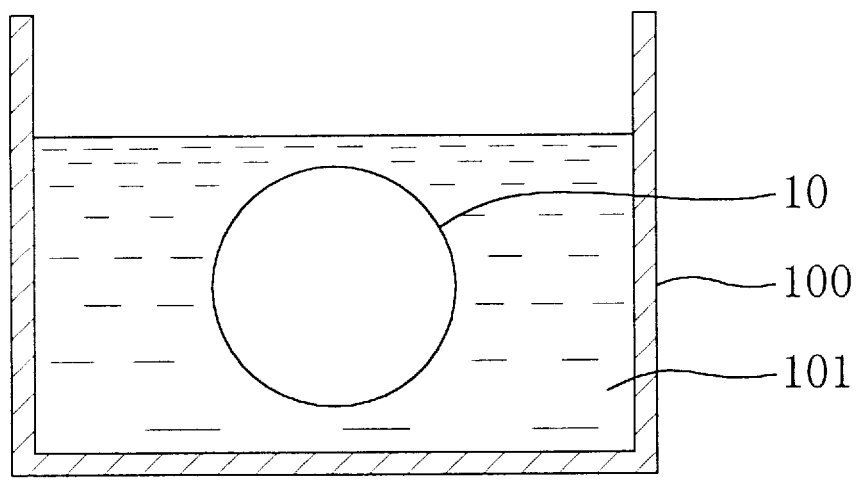
FIG. 9 is a schematic cross-sectional view of a first apparatus for forming a copper sulfide film.

FIG. 9 is a schematic cross-sectional view of an apparatus for forming a copper sulfide film, in which a stock solution 101 of a sulfide such as ammonia sulfide is stored in a container 100. The semiconductor substrate 10 formed with the metal wire 12 as shown in FIG. 4 is immersed in the stock solution 101 of ammonia sulfide for about 10 seconds and retrieved to be subjected to water washing and drying processes. During the processes, copper locally precipitated on the surface of the metal wire 12 reacts with ammonia sulfide to form the copper sulfide films 14 on the side faces of the metal wire 12. The first method of forming a copper sulfide film described above is the simplest method that can be implemented at low cost.

A description will be given to a second method of forming a copper sulfide film.

Figure 10:
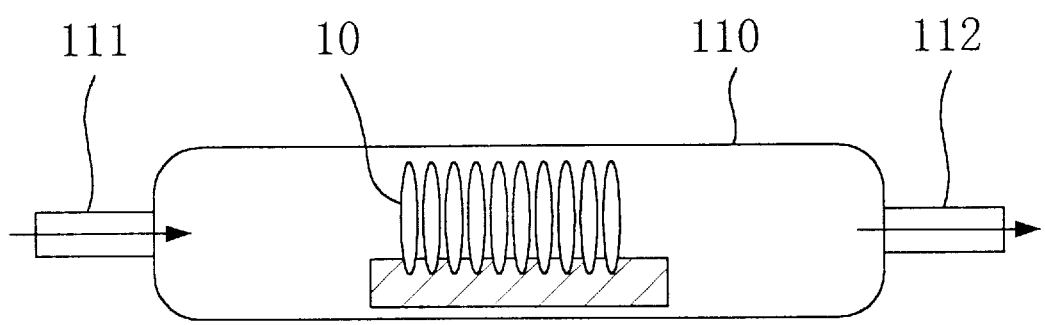
FIG. 10 is a schematic cross-sectional view of a second apparatus for forming a copper sulfide film.

FIG. 10 schematically shows a cross-sectional structure of an apparatus for forming a copper sulfide film by using gas, which comprises: a vacuum furnace 110; a gas inlet 111 for introducing a mixture of hydrogen sulfide gas and nitrogen gas into the vacuum furnace 110; and a gas outlet 112 for exhausting the gas mixture from the vacuum furnace 110. The semiconductor substrate 10 as a wafer formed with the metal wire 12 as shown in FIG. 4 is placed in the vacuum furnace 110 and, subsequently, the mixture of hydrogen sulfide gas and nitrogen gas is introduced into the vacuum furnace 110. In this case, the pressure inside the vacuum furnace 110 is adjusted to be about 200 Torr, while room temperature is maintained in the vacuum furnace 110 to prevent an increase in the thickness of a native oxide film of aluminum formed on the surface of the metal wire 12. The semiconductor substrate 10 is then exposed to the mixture of hydrogen sulfide gas and nitrogen gas for about 30 minutes and retrieved from the vacuum furnace 110. During the exposure, copper locally precipitated on the surface of the metal wire 12 reacts with the hydrogen sulfide gas to form the copper sulfide films 14 on the side faces of the metal wire 12.

A description will be given to a third method of forming a copper sulfide film.

Figure 11:
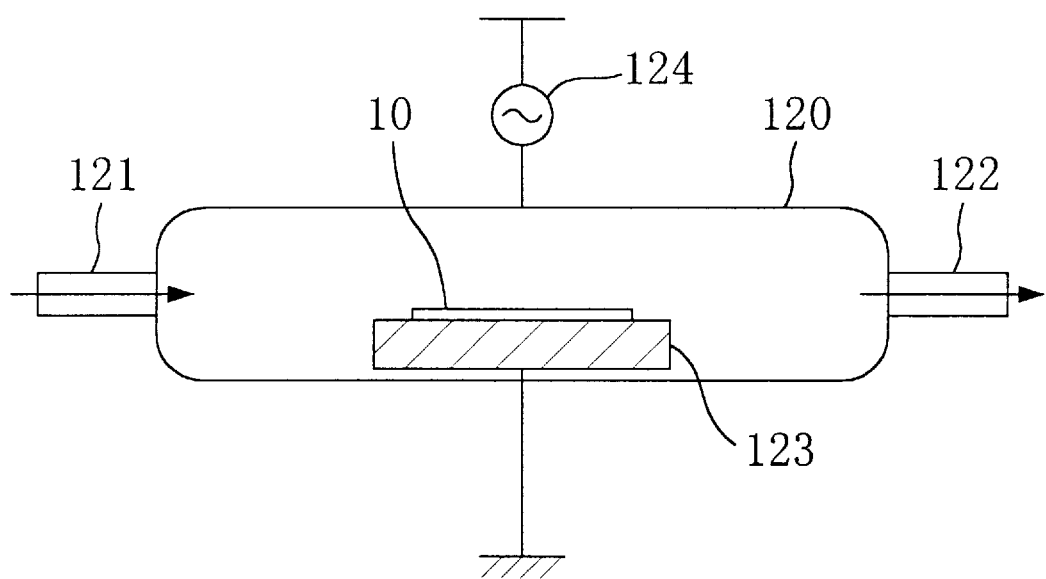
FIG. 11 is a schematic cross-sectional view of a third apparatus for forming a copper sulfide film.

FIG. 11 schematically shows a cross-sectional structure of an apparatus for forming a copper sulfide film by using a plasma, which comprises: a vacuum furnace 120 held under a reduced pressure of about 200 mTorr; a gas inlet 121 for introducing hydrogen sulfide gas into the vacuum furnace 120; a gas outlet 122 for exhausting the gas from the vacuum furnace 120; a sample stage 123 disposed in the vacuum furnace 120 and grounded; and an RF power source 124 for applying RF power of 300 W at a frequency of 13.56 MHz. From the gas inlet 121, the hydrogen sulfide gas is introduced at a flow rate of 30 sccm into the vacuum furnace 120, while the RF power is supplied from the RF power source 124 into the vacuum furnace 120, thereby generating a plasma of the hydrogen sulfide gas in the vacuum furnace 120. During the process, ions of the hydrogen sulfide gas react with copper locally precipitated on the surface of the metal wire 12 to form the copper sulfide films 14 on the side faces of the metal wire 12.

A description will be given to a fourth method of forming a copper sulfide film.

Ammonia sulfide is previously added to a cleaning liquid containing a nitric acid, which is used to clean the surface of the semiconductor substrate 10 formed with the metal wire 12, as shown in FIG. 4(a). During the cleaning process, copper locally precipitated on the surface of the metal wire 12 reacts with ammonia sulfide contained in the cleaning liquid to form the copper sulfide films 14 on the side faces of the metal wire 12. In accordance with the fourth method of forming a copper sulfide film, the copper sulfide films 14 can be formed during the cleaning process with an extremely high efficiency.

A description will be given to a fifth method of forming a copper sulfide film.

Prior to the ashing performed with respect to the resist pattern 16 by using the oxygen plasma as shown in FIG. 3(c), hydrogen sulfide gas is added to the oxygen gas to be introduced into the vacuum furnace, so that a plasma of the hydrogen sulfide gas as well as the plasma of the oxygen gas is generated. During the process, copper locally precipitated on the surface of the metal wire 12 reacts with ions of hydrogen sulfide to form the copper sulfide films 14 on the side faces of the metal wire 12. In accordance with the fifth method of forming a copper sulfide film, the sulfide films 14 can be formed during the ashing process with an extremely high efficiency.

(Second Method of Manufacturing Semiconductor Device According to First Embodiment)

A second method of manufacturing the semiconductor device according to the first embodiment will be described with reference to FIGS. 5(a) to 5(c) and FIGS. 6(a) to 6(c).

Figure 5A:
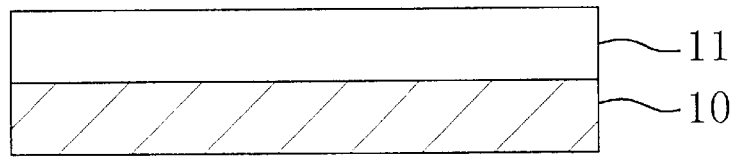
FIG. 5(a) to 5(c) are cross-sectional views illustrating the individual process steps by a second method of manufacturing the semiconductor device according to the first embodiment.
Figure 5B:
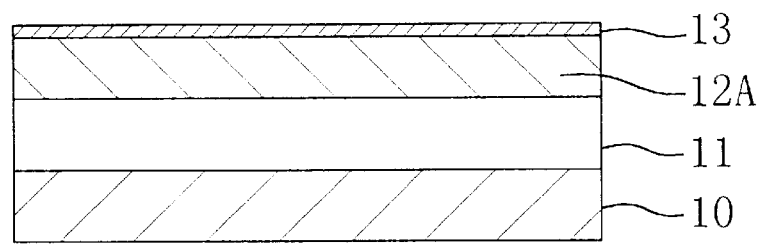

First, as shown in FIG. 5(a), the first silicon oxide ($SiO_2$) film 11 as the first insulating film is formed on the semiconductor substrate 10. Then, as shown in FIG. 5(b), the metal film 12A made of an aluminum alloy containing copper and the antireflection film 13 are deposited sequentially on the first silicon oxide film 11.

Figure 5C:
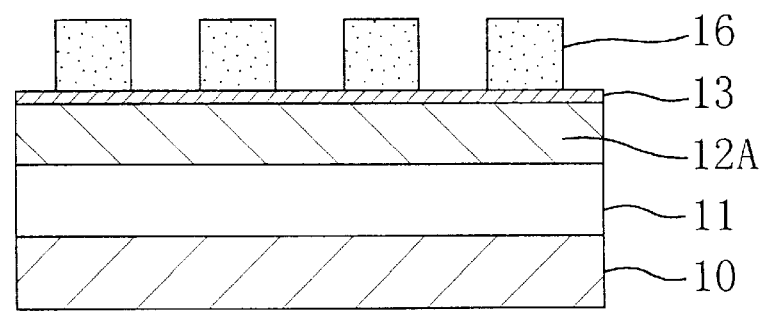

Next, as shown in FIG. 5(c), the resist pattern 16 is formed on the antireflection film 13, which is then used as a mask in a dry-etching process performed with respect to the antireflection film 13 and the metal film 12A, during which the copper sulfide films 14 are formed on the side faces of the metal wire 12. A method of forming the copper sulfide films 14 during the etching process will be described as a sixth method of forming a copper sulfide film.

Figure 6A:
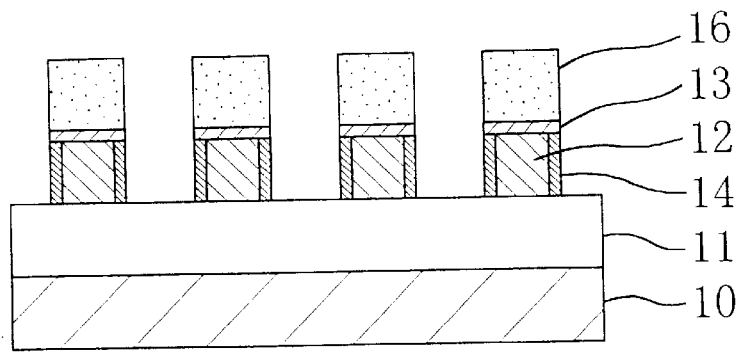
FIG. 6(a) to 6(c) are cross-sectional views illustrating the individual process steps by the second method of manufacturing the semiconductor device according to the first embodiment.

Prior to the dry etching process, hydrogen sulfide gas is added to an etching gas for etching the metal film 12A formed on the surface of the semiconductor substrate 10. When the antireflection film 13 and the metal film 12A are etched by using the resist pattern 16 as a mask and the etching gas containing the hydrogen sulfide gas, copper locally precipitated on the surface of the metal wire 12 reacts with the hydrogen sulfide gas during the etching process for forming the metal wire 12 from the metal film 12A as shown in FIG. 6(a), resulting in the copper sulfide films 14 formed on the side faces of the metal wire 12.

Figure 6B:
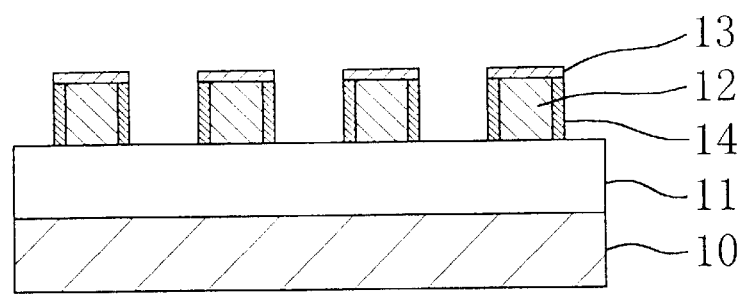
Figure 6C:
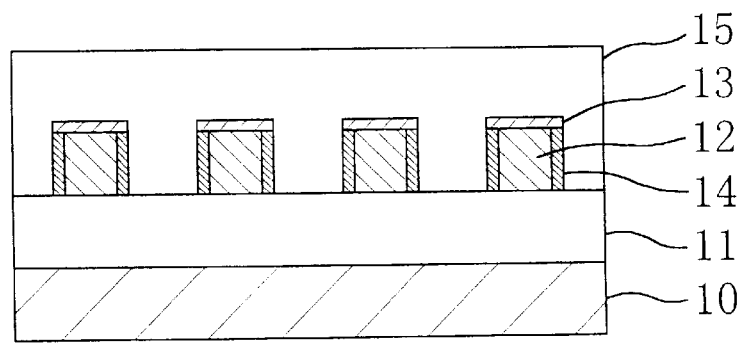

Thereafter, the resist pattern 16 is removed by ashing, as shown in FIG. 6(b), followed by the deposition of the second silicon oxide film 15 as the second insulating film over the entire surface.

(First Method of Manufacturing Semiconductor Device According to Second Embodiment)

A first method of manufacturing the semiconductor device according to the second embodiment will be described with reference to FIGS. 7(a) to 7(c) and FIGS. 8(a) to 8(c).

Figure 7A:
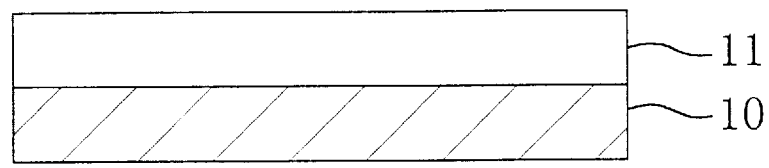
FIG. 7(a) to 7(c) are cross-sectional views illustrating the individual process steps by a first method of manufacturing the semiconductor device according to the second embodiment.

First, as shown in FIG. 7(a), the first silicon oxide ($SiO_2$) film 11 as the first insulating film is formed on the semiconductor substrate 10. Then, as shown in FIG. 7(b), the metal film 12A made of an aluminum alloy containing copper is deposited on the first silicon oxide film 11.

Figure 7B:
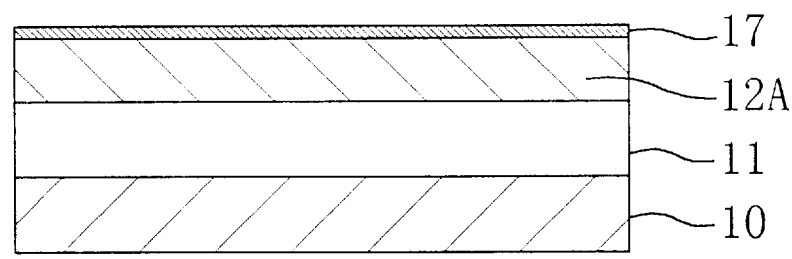

Next, as shown in FIG. 7(b), a first copper sulfide film 17 is formed over the entire surface of the metal film 12A in accordance with the first to fourth methods of forming copper sulfide films described above, thereby protecting the surface of copper locally precipitated on the surface of the metal film 12A.

Figure 7C:
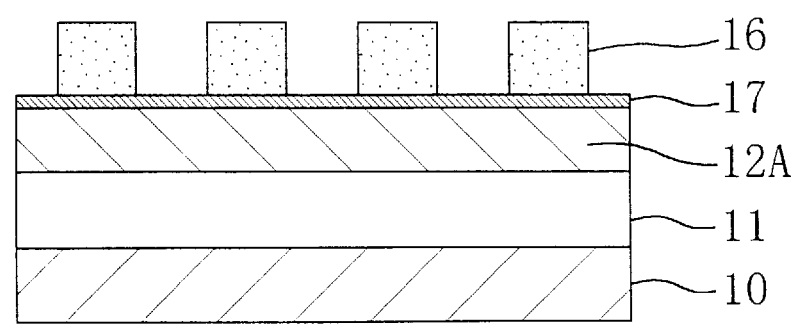

Next, as shown in FIG. 7(c), the resist pattern 16 is formed on the first copper sulfide film 17, which is then used as a mask in a dry-etching process performed with respect to the first copper sulfide film 17 and the metal film 12A to form the metal wire 12, followed by the removal of the resist pattern 16 by ashing.

Figure 8A:
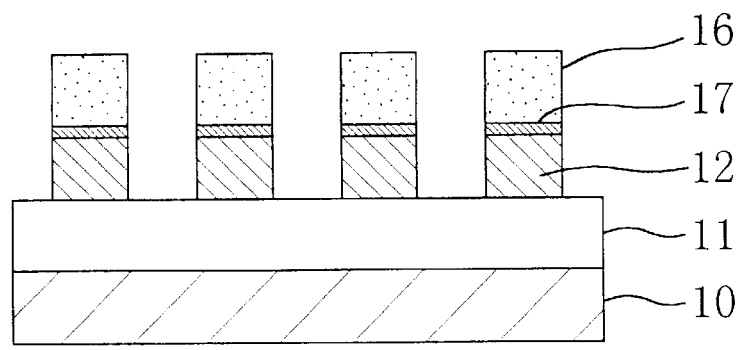
FIG. 8(a) to 8(c) are cross-sectional views illustrating the individual process steps by the first method of manufacturing the semiconductor device according to the second embodiment.
Figure 8B:
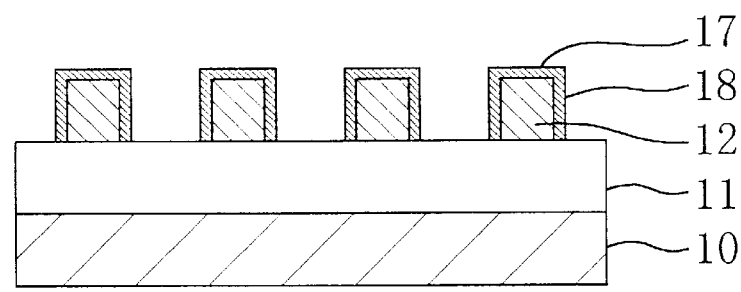
Figure 8C:
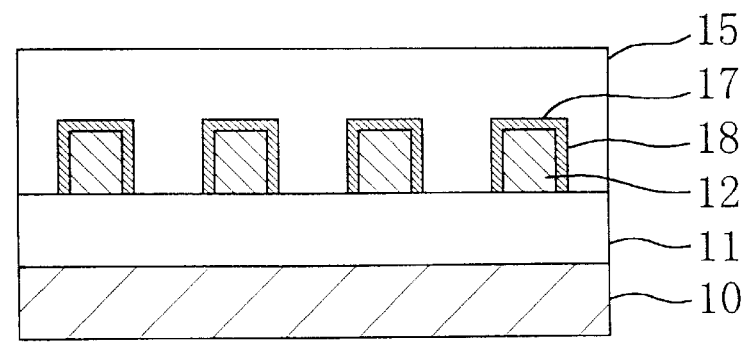

Next, as shown in FIG. 8(b), second copper sulfide films 18 are formed on the side faces of the metal wire 12 in accordance with the first to sixth methods of forming copper sulfide films described above, thereby protecting the surface of copper locally precipitated on the surface of the metal wire 12. After that, a cleaning process is performed so that the second silicon oxide film 15 as the second insulating film is deposited over the entire surface, resulting in the semiconductor device as shown in FIG. 1(b), in which the copper sulfide film 24 is formed on the portions of the top and side faces of the metal wire 22 uncovered with the aluminum oxide film 29.

(Second Method of Manufacturing Semiconductor Device According to Second Embodiment)

A description will be given to a second method of manufacturing the semiconductor device according to the second embodiment. Since the second manufacturing method is implemented by omitting the first step of forming a copper sulfide film from the first method of manufacturing the semiconductor device according to the second embodiment, the drawing thereof is omitted here.

First, the first silicon oxide ($SiO_2$) film as the first insulating film is formed on the semiconductor substrate. Then, the metal film made of an aluminum alloy containing copper is deposited on the first silicon oxide film.

Next, the resist pattern is formed on the metal film, which is then used as a mask in a dry-etching process performed with respect to the metal film to form the metal wire, followed by the removal of the resist pattern by ashing.

Next, the copper sulfide film is formed on the top and side faces of the metal wire in accordance with the first to sixth methods of forming copper sulfide films described above, thereby protecting the surface of copper locally precipitated on the surface of the metal wire. After that, a cleaning process is performed so that the second silicon oxide film as the second insulating film is formed over the entire surface, resulting in the semiconductor device as shown in FIG. 1(b), in which the copper sulfide film is formed on the portions of the entire surface of the metal wire uncovered with the aluminum oxide film.

FIG. 12(a) is a micrograph showing a two-dimensional structure of a metal wire with a copper sulfide film formed on the surface thereof. FIG. 12(b) is a micrograph showing a two-dimensional structure of a metal wire without a copper sulfide film. As is apparent from FIG. 12(a), no corrosion occurs on the surface of the metal wire without the organic film that has conventionally been formed as a protecting film on the surface of the metal wire by plasma processing using $CF_4$, as described above. By contrast, a corrosive product is formed on the metal wire without a copper sulfide film, as shown in FIG. 12(b). The corrosive product is observed on the side face of the upper wire and on the side face of the lower wire, each located in the center of the micrograph of FIG. 12(b).

We claim:

1. A method of manufacturing a semiconductor device, comprising:

a metal-film depositing step of depositing a metal film on a semiconductor substrate;

an antireflection-film depositing step of depositing an antireflection film on said metal film;

a resist-pattern forming step of forming a resist pattern on said antireflection film;

a metal-wire forming step of forming a metal wire composed of said metal film by etching said antireflection film and said metal film by using said resist pattern as a mask; and a sulfide-film forming step of forming, after removing said resist pattern, copper sulfide films on the regions of the both side faces of said metal wire uncovered with an aluminum oxide film.

2. A method of manufacturing a semiconductor device according to claim 1, wherein said sulfide-film forming step includes the step of forming said copper sulfide films by immersing said semiconductor substrate in a solution of ammonia sulfide.

3. A method of manufacturing a semiconductor device, comprising:

a metal-film depositing step of depositing a metal film on a semiconductor substrate;

a resist-pattern forming step of forming a resist pattern on said metal film;

a metal-wire forming step of forming a metal wire composed of said metal film by etching said metal film by using said resist pattern as a mask; and a sulfide-film forming step of forming, after removing said resist pattern, a copper sulfide film on the regions of the top face and both side faces of said metal wire uncovered with an aluminum oxide film.

4. A method of manufacturing a semiconductor device according to claim 3, wherein said sulfide-film forming step includes the step of forming said copper sulfide film by immersing said semiconductor substrate in a solution of ammonia sulfide.

5. A method of manufacturing a semiconductor device, comprising:

a metal-film depositing step of depositing a metal film on a semiconductor substrate;

a first sulfide-film forming step of forming a copper sulfide film on the region of the top face of said metal film uncovered with an aluminum oxide film;

a resist-pattern forming step of forming a resist pattern on said copper sulfide film;

a metal-wire forming step of forming a metal wire composed of said metal film by etching said metal film by using said resist pattern as a mask; and a second sulfide-film forming step of forming, after removing said resist pattern, a copper sulfide film on the region of said metal wire uncovered with an aluminum oxide film.

6. A method of manufacturing a semiconductor device according to claim 5, wherein at least one of said first sulfide-film forming step and said second sulfide-film forming step includes the step of forming said copper sulfide film by immersing said semiconductor substrate in a solution of ammonia sulfide.

* * * * *